Aug. 4, 1959 C. J. CREVELING 2,898,521
ELECTRIC CIRCUIT COMPONENT
Filed Sept. 28, 1956 2 Sheets-Sheet 1
FIG. 1
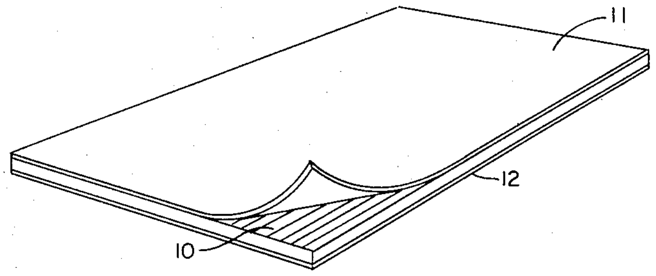
FIG. 2 FIG. 3 FIG. 4
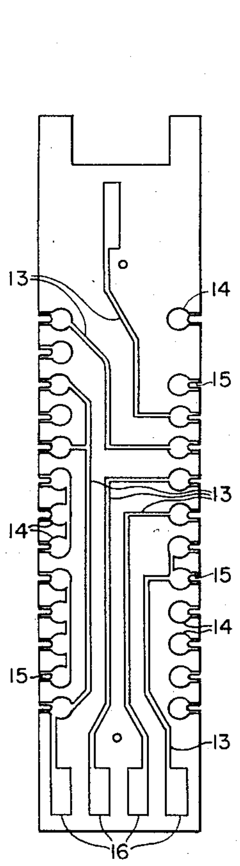
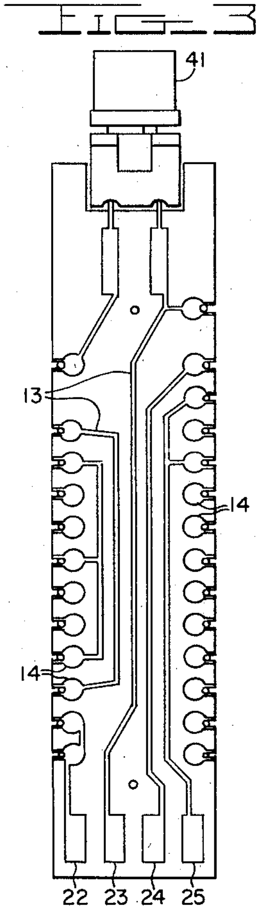
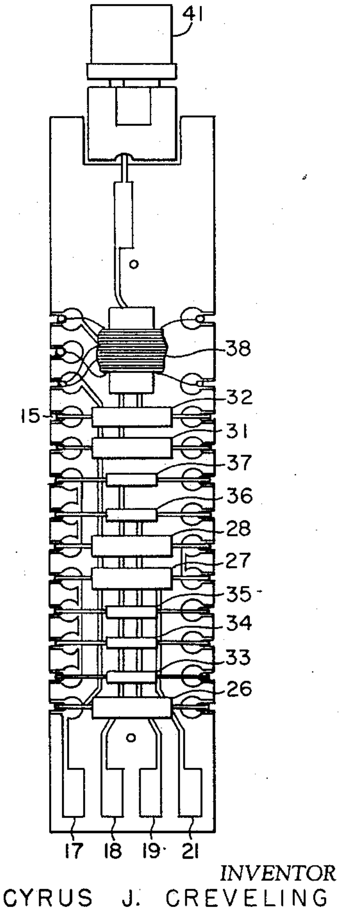
INVENTOR
CYRUS J. CREVELING
BY W.R. Maltby
Richard C. Reed ATTORNEYS Aug. 4, 1959 C. J. CREVELING 2,898,521

ELECTRIC CIRCUIT COMPONENT

Filed Sept. 28, 1956 2 Sheets-Sheet 2

INVENTOR
CYRUS J. CREVELING

BY W. R. Maltby
Richard C. Reed
ATTORNEYS

United States Patent Office 2,898,521
Patented Aug. 4, 1959

2,898,521

ELECTRIC CIRCUIT COMPONENT

Cyrus J. Creveling, Oxon Hill, Md., assignor to the United States of America as represented by the Secretary of the Navy Application September 28, 1956, Serial No. 612,901

4 Claims. (Cl. 317—101)

(Granted under Title 35, U.S. Code (1952), sec. 266)

The invention described herein may be manufactured and used by or for the Government of the United States of America for governmental purposes without the payment of any royalties thereon or therefor.

This invention relates to an electric circuit component and more particularly to such a component in which conductive strips positioned thereon have terminal portions located at the edges of said component.

Printed electrical circuit components are known in which leads of the electrical elements, such as resistors, condensers, diodes, etc., to be attached to a board are inserted in small holes in the conductor and dielectric of the component. The underside of such a component is then dipped in a molten solder bath to secure the electrical elements to the conductor. Circuits constructed in this manner are adequate for many purposes, but when a great number of circuits are to be assembled or when the individual components of the assembly require frequent testing, they suffer from a number of disadvantages. Specifically, placing the leads of the elements in the necessarily small holes is tedious, time consuming and must be performed either by hand or by machines of high precision. Also, one surface of the whole circuit component must be dipped in the solder bath, thus electrical elements must be positioned on one side of the board or made resistant to the high temperatures of the molten solder. Testing the individual electrical elements mounted on the board is very troublesome as the element leads are usually positioned at random and not in a well defined pattern. Testing techniques which consume an inordinate amount of time, as are required by this type of circuit arrangement, are very disadvantageous where hundreds or thousands of circuits may be involved.

The present invention avoids the above mentioned disadvantages by providing an electrical circuit component in which all electrical element leads are attached along the edges of the component, rather than through holes which may be located at random. A wiring pattern is "printed" on a sheet of insulating material typically by means of a photo-chemical process, die-stamping or any other suitable process in such configuration that the terminals of the conductive strips of the wiring pattern are located at the edges of the sheet. Perforations, typically slots, are then cut in the sheet at these terminal portions for the reception of leads of the electrical elements which are mounted on the sheet. The attachment of electrical elements such as resistors, diodes, condensers, etc. lends itself very readily to automation with machines which need not be of a highly precise nature since the leads merely need to be bent down into the slots provided. To solder the leads to the terminals of the conductive strips only the edges of the sheet of insulating material need be immersed in a solder bath, thus circuit elements may be placed on either side of the sheet of insulating material.

All leads of electrical elements and all circuit junctions and terminations requiring soldering or connection to external circuitry are located on the edges of the circuit component where they are readily accessible. A circuit made in accordance with the present invention can be placed in a simple test jig which makes contact with all leads of all elements so that they may be tested semi-automatically if desired.

An object of the present invention is the provision of an electric circuit component in which the terminals of the electrical elements to be mounted thereon are readily accessible to electrical testing equipment.

Another object of the invention is the provision of an electrical circuit component on which electrical circuit elements can be mounted and attached by relatively simple and low precision automatic machinery.

A further object of the invention is the provision of an electrical circuit component on which electrical circuit elements can be dip-soldered without immersing the whole component or any electrical elements in the solder bath.

Still another object of the invention is to provide a small compact electrical circuit component on which can be mounted complete computer sub-circuits.

Other objects and many of the attendant advantages of this invention will be readily appreciated as the same becomes better understood by reference to the following detailed description when considered in connection with the accompanying drawings wherein:

Fig. 1 shows a sheet of insulating material with two sheets of conducting material laminated on each side.

Fig. 2 shows a top plan view of a circuit component made from the laminated sheets of Fig. 1.

Fig. 3 shows a bottom plan view of a typical computer circuit mounted on the circuit component of Fig. 2.

Fig. 4 shows a top plan view of the circuit component of Fig. 3 with the typical computer circuit mounted thereon.

Figure 5:
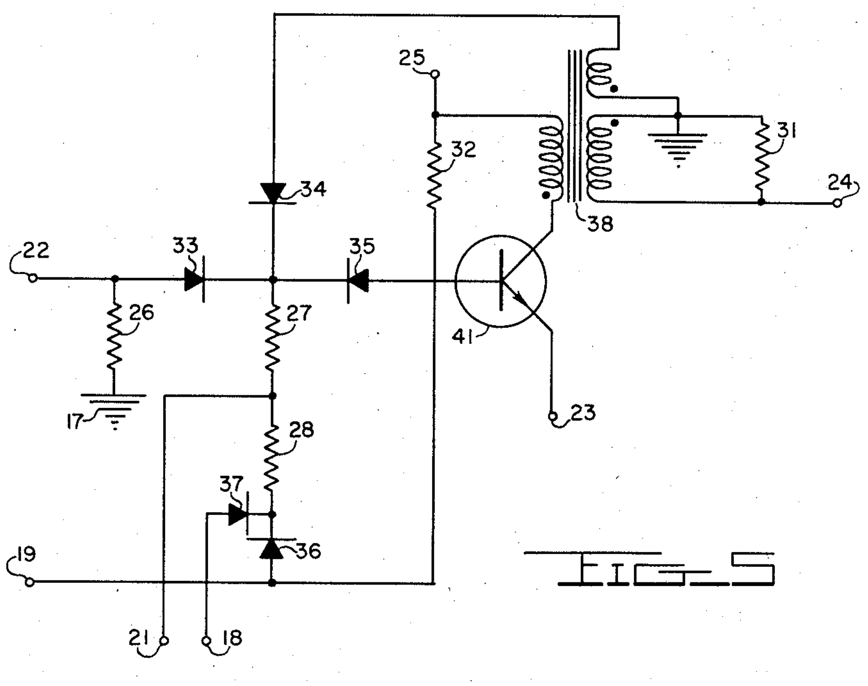
Fig. 5 is a wiring diagram of the computer circuit shown in Figs. 3 and 4.

Referring now to Fig. 1, there is shown a sheet of insulating material 10, for example, paper layers impregnated with Bakelite or any other suitable plastic, having conductive sheets 11 and 12, preferably copper or silver but which can be any suitable conductor, glued or otherwise bonded thereto on two opposed surfaces. Although it is normally preferably to have the conductive layers on both sides of the insulating sheet, it is obvious that a perfectly satisfactory circuit component could be made with a conductive sheet on only one surface of the insulating sheet. In one of the circuits with which the present circuit component may be used—that of a gated amplifier circuit shown in Figs. 4 and 5—the dimensions of the sheets are ⅝ inch wide by 2¾ inches long. In actual manufacture, of course, much larger sheets could be used and cut to appropriate size after the wiring pattern has been formed but, for purposes of illustration, one small component of circuit size will be described. The conductive sheets shown in Fig. 1 are reduced by photo-engraving, die-stamping or other suitable means to leave a specific circuit or wiring pattern as typified in Figs. 2 and 3. This wiring pattern, shown for the purposes of illustration only, is suitable for constructing the gated amplifier shown in Figs. 4 and 5 and consists of a series of conductive strips 13 which terminate in enlarged terminal portions or blocks 14 along the two long edges of the insulating sheet 10. The terminal portions or blocks 14 extend to the edges of the sheet of insulating material 10 in the preferred embodiment of the invention for reasons to be given later in the specification, however, it is obvious that a workable circuit component could be constructed in which the terminal portions 14 do not extend to the edge but terminate a short distance therefrom. At these terminal portions, slots 15 typically rectangular in shape are cut in the circuit components for the reception of the terminal leads of electrical elements which may be mounted on the insulating sheet. These slots are cut to a depth sufficient to intersect the terminal portions 14 so that the electrical element leads will contact the conductive material on both surfaces of the insulating sheet 10. Along one short edge of the insulating sheet there is provided a number of connector blocks generally designated by the numeral 16 which are employed to connect the circuit component and electrical elements mounted thereon into a larger electrical device such as a digital computer.

In the formation of a complete circuit or sub-circuit, for example, in a computer system, electrical elements such as resistors, condensers, diodes, transformers, coils, transistors, etc., are used which are smaller in their long dimension than the width of the insulating sheet 10. These electrical elements are laid upon the component and their terminal wires bent into slots 15 so that the appropriate terminal portion 14 is in contact with the terminal lead. The edges of the component with the circuit elements mounted thereon may then be dipped in a molten solder bath to complete the circuit.

As can best be seen by reference to Fig. 2, the terminal portions 14 extend to the edges of the circuit component so that only the extreme edges of the component need be dipped in the solder bath as the solder will travel up the terminal blocks 14 by surface tension and coat the entire block.

Figure 6:
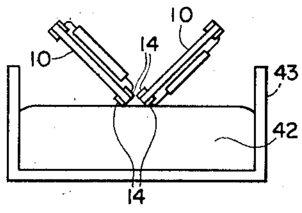
Figs. 6, 7 and 8 show the circuit component of the present invention being dipped in a molten solder bath by various methods.
Figure 7:
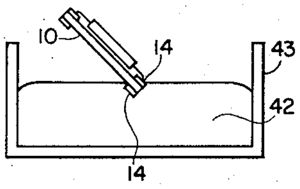

Referring to Fig. 6, there is shown a molten solder bath 42 in a suitable container 43, for use in dip soldering the circuit component of the present invention which is shown in end elevation. The component may be dipped in the bath so that one surface forms an acute angle with surface of the solder bath as shown here and only the extreme edge of the insulating sheet 10 and the edges of the terminal portions 14 on one surface of the component need be dipped in the bath. The component may then be turned so that its other surface faces the molten solder and forms an acute angle therewith, as shown, and the terminal portions 14 on the other surface are coated with solder. Then, of course, it is necessary to solder the leads of the circuit elements to the terminal portions 14 positioned at the opposite edge of the insulating sheet by repeating the steps described above. This method of dip soldering is particularly advantageous when it is desired to protect the insulating sheet from excessive heat since only the extreme edges need be dipped in the molten bath. If, however, the insulating material 10 is highly heat resistant the component can be dipped at an angle as shown in Fig. 7 to such a depth that the terminal portions 14 on both surfaces of the insulating sheet come into contact with the molten solder; the solder will then travel up the upper terminal portion 14 by surface tension and coat the entire terminal. The circuit element leads must then be soldered to the terminal portions 14 on the opposite edge by repeating the above step. Soldering by this method has the advantage of protecting the circuit elements which are to be soldered to the terminal portions from the heat of the bath, as the insulating material 10 is positioned between the heat and the circuit elements.

Figure 8:
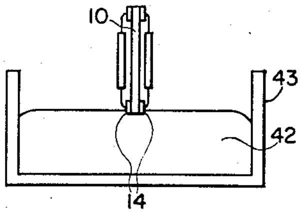

Another method of dip soldering can also be employed which is particularly advantageous when electrical elements are to be mounted on both sides of the insulating maerial 10; the edge of the circuit component is dipped in the bath so that the upper surface of the molten solder and the faces or surfaces of the insulating material upon which the circuit components are mounted, intersect at substantially right angles as shown in Fig. 8. Only the extreme edges of the terminal portions 14 and the insulating material 10 need be dipped in the molten solder as the solder will travel up the terminal portions and coat its entire surface by surface tension. The dipping is then repeated with the terminal portions 14 on the opposite edge of the insulating sheet 10 being dipped in the solder.

In all these various methods of soldering, the insulating material 10, terminal portions 14 and conductive strips 13 are subjected to a minimum of heat from the solder bath as terminal portions 14 extend to the edges of the board and only the extreme edge of the terminals and insulating material need be immersed in the bath.

The circuit component of this invention is particularly useful in constructing digital computer sub-circuits such as a four input "Or" circuit, a two input "And" circuit, and "Exclusive Or" circuit or a gater, quantizing amplifier circuit as shown in Fig. 5. This circuit has the following terminal connections as shown in Figs. 3–5, a ground connection 17, a clock input 18, an "A" to "And" gate input 19, diode biasing input 21, trigger input 22, emitter biasing input 23, output 24 and collector biasing input 25. The circuit components are resistors 26, 27, 28, 31 and 32, diodes 33, 34, 35, 36 and 37, transformer 38, and NPN junction transistor 41. Although the specific gated amplifier circuit shown in Figs. 3–5 is not herein claimed per se, it is included to illustrate how a relatively complex computer sub-circuit can be mounted on an electrical circuit component made in accordance with the principles of the invention so that each and every electrical circuit element has terminals located on the edge of the component. The operation of this circuit is more fully explained in my copending application Serial No. 619,090, filed October 29, 1956.

As pointed out previously, semi-automatic testing techniques can be used to test the individual circuit elements mounted on the component, for example, the circuit assembly of Figs. 3 and 4 can be placed in a jig so that each slot or electrical circuit element terminal makes contact with a multiple switch which is connected to an ohmmeter. By merely rotating the multiple switch the ohmmeter can be read across each and every electrical element.

It should be understood, of course, that the foregoing disclosure relates to only a preferred embodiment of the invention and that it is intended to cover all changes and modifications of the example of the invention herein chosen for the purposes of the disclosure, which do not constitute departures from the spirit and scope of the invention.

What is claimed is:

1. An electric circuit component comprising a base member of insulating material having flat parallel surfaces, a plurality of slots formed in each of two opposed edges of said base member, separate conductive means positioned to be contiguous with each of said slot means, each of said slot means, together with its respective conductive means, being formed to provide an opening with parallel sides terminating at said edges of said base member, one of the other two opposed edges of said base member being provided with conductive means for connecting said circuit component to a source of electrical energy, and notch means on the second of the other opposed edges of said base member with conductive material positioned to be the connection means of a multi-terminal circuit element positioned therein.

2. An electric circuit component comprising a base member of insulating material having flat parallel surfaces, a plurality of slots formed in each of two opposed edges of said base member, separate conductive means positioned to be contiguous with each of said slot means, each of said slot means, together with its respective conductive means, being formed to provide an opening with parallel sides substantially perpendicular to and terminating at said edges of said base member, one of the other two opposed edges of said base member being provided with conductive means for connecting said circuit component to a source of electrical energy, and notch means on the second of the other opposed edges of said base member with conductive material positioned to be the connection means of a multi-terminal circuit element positioned therein.

3. An electric circuit component comprising a base member of insulating material having flat parallel surfaces, a plurality of slots formed in each of two opposed edges of said base member, the slots of the two opposed edges being arranged in opposed pairs, separate conductive means positioned to be contiguous with each of said slot means, each of said slot means together with its respective conductive means, being formed to provide an opening with parallel sides terminating at said edges of said base member, one of the other two opposed edges of said base member being provided with conductive means for connecting said circuit component to a source of electrical energy, and notch means on the second of the other opposed edges of said base member with conductive material positioned to be the connection means of a multi-terminal circuit element positioned therein.

4. An electric circuit component comprising a base member of insulating material having flat parallel surfaces, primary portions of conductive material positioned adjacent two opposed edges thereof for connecting multi-terminal circuit elements to said circuit component, secondary conductive portions positioned adjacent a third edge of said base member for connecting said circuit component to a source of electrical energy, conductive means interconnecting said conductive portions, a plurality of slot means formed in each of the two opposed edges of said base member, the slots of the two opposed edges being arranged in opposed pairs, each of said slot means, together with its respective conductive means, being formed to provide an opening with parallel sides terminating at said edges of said base member, and notch means in a fourth edge of said base member with secondary portions of conductive material positioned to be the connection means of a multi-terminal circuit element positioned therein.

References Cited in the file of this patent

UNITED STATES PATENTS

| | | |
|---|---|---|
| 2,244,009 | Hiensch | June 3, 1941 |
| 2,466,192 | Wood | Apr. 5, 1949 |
| 2,693,584 | Pifer | Nov. 2, 1954 |
| 2,774,014 | Henry | Dec. 11, 1956 |
| 2,777,193 | Albright | Jan. 15, 1957 |
| 2,850,681 | Horton | Sept. 2, 1958 |